United States Patent [19]
> Mansfield et al.

[11] Patent Number: 4,978,920

[45] Date of Patent: Dec. 18, 1990

[54] MAGNETIC FIELD SCREENS

[75] Inventors: Peter Mansfield; Barry L. W. Chapman; Robert Turner; Roger M. Bowley, all of Nottingham, England

[73] Assignee: National Research Development Corporation, London, England

[21] Appl. No.: 338,392

[22] Filed: Apr. 14, 1989

Related U.S. Application Data

[63] Continuation of Ser. No. 909,292, Sep. 19, 1986, abandoned.

[30] Foreign Application Priority Data

Sep. 20, 1985 [GB] United Kingdom ............... 8523326
Feb. 6, 1986 [GB] United Kingdom ............... 8602911
Jun. 19, 1986 [GB] United Kingdom ............... 8614912

[51] Int. Cl.$^5$ ............................................. G01R 33/20
[52] U.S. Cl. ....................................... 324/318; 335/216
[58] Field of Search ............... 324/300, 307, 309, 318, 324/322; 335/299, 301, 304

[56] References Cited

U.S. PATENT DOCUMENTS

| | | | |
|---|---|---|---|
| 3,466,499 | 9/1969 | Beth | 335/216 |
| 3,493,904 | 2/1970 | Favereau | 335/299 |
| 3,671,902 | 6/1972 | Westendorp | 335/216 |
| 4,595,899 | 6/1986 | Smith et al. | 324/320 |
| 4,612,505 | 9/1986 | Zijlstra | 324/318 |
| 4,646,045 | 2/1987 | Chari et al. | 335/301 |
| 4,646,046 | 2/1987 | Vavrek et al. | 335/301 |
| 4,733,189 | 3/1988 | Punchard | 324/318 |
| 4,737,716 | 4/1988 | Roemer | 324/318 |

Primary Examiner—Michael J. Tokar
Attorney, Agent, or Firm—Cushman, Darby & Cushman

[57] ABSTRACT

The screen is provided by surrounding the coil producing the magnetic field with a set of electrical conductors the currents within the conductors being controlled in such a manner that the field is neutralized in a specific region of space, the current distribution within the conductors being determined by calculating the current within a hypothetical superconductive shield which would have the effect of neutrailizing the field, the current through the conductors thereby being a substitute for the superconductive shield.

37 Claims, 13 Drawing Sheets

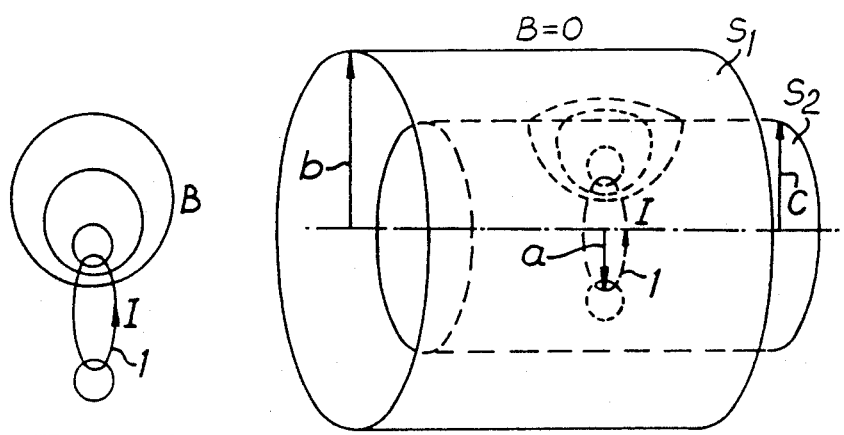
Fig. 22
Fig. 23
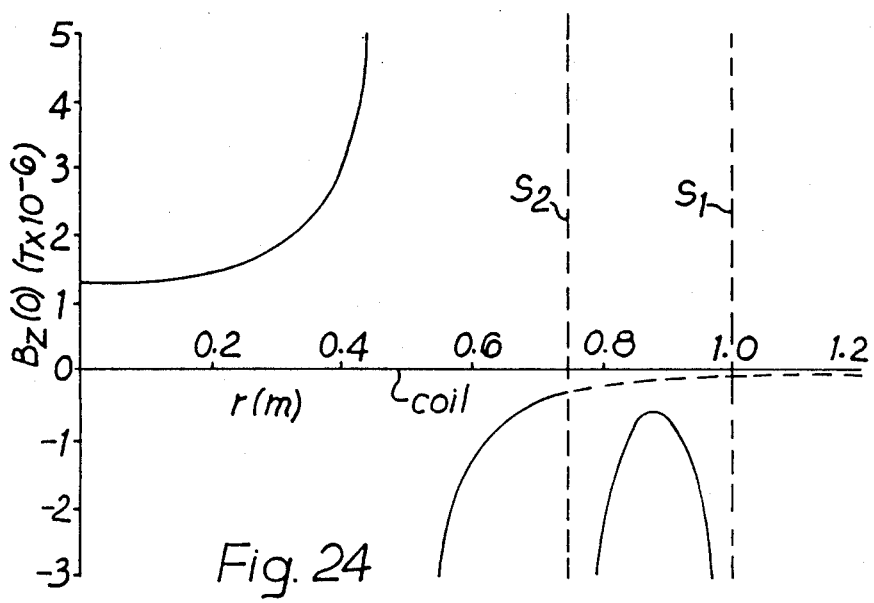
Fig. 24

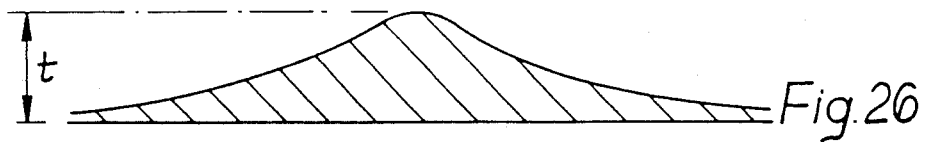
Fig.26
Fig.27
Fig.28
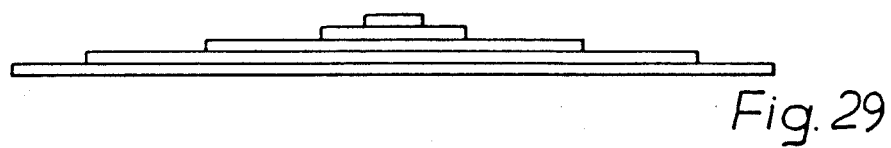
Fig.29
$I_4$ $I_3$ $I_2$ $I_1$ $I_0$ $I_1$ $I_2$ $I_3$ $I_4$
Fig.30
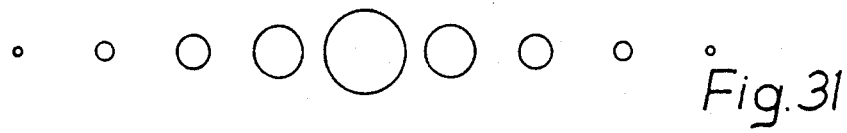
Fig.31
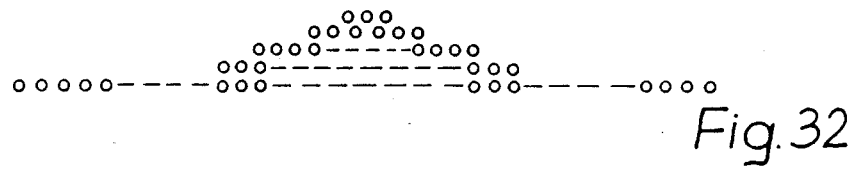
Fig.32
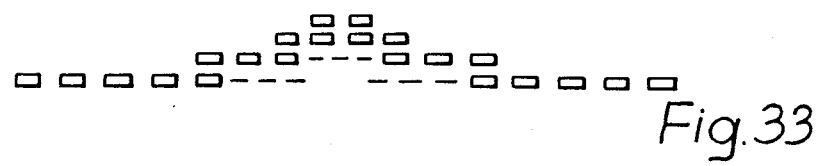
Fig.33

MAGNETIC FIELD SCREENS

This is a continuation of application Ser. No. 909,292, filed Sept. 19, 1986, which was abandoned upon the filing hereof.

FIELD OF THE INVENTION

This invention relates to magnetic field screens and has application in NMR imaging apparatus.

BACKGROUND OF THE INVENTION

Current carrying magnet coils are used for a variety of purposes in NMR imaging apparatus. Examples include large electro-magnets designed to provide static magnetic fields to polarize nuclear spins, magnetic field gradient coils which superimpose gradients onto the static polarizing field and rf transmitter and receiver coils.

In many cases the design of a magnet coil is such as to optimize the magnetic field within a desired volume. However the coil inevitably produces an extraneous magnetic field outside that volume, especially relatively close to the coil. In the case of large bore static electro-magnets the high fields they generate will produce undesirably strong extraneous fields at distances outside the magnet corresponding to many magnet diameters. Such magnet systems therefore require much free and unusable space around their installation. Stray magnetic fields may be intolerable in hospitals because of iron structures positioned around the installation site which vitiate the homogeneity of the magnetic field. Additionally, electronic equipment may not perform well in an environment which has an extraneous magnetic field.

Furthermore, most NMR imaging systems utilize rapidly switched magnetic field gradients in their operation. A major problem epecially where super-conductive magnets are used, is the interaction of the gradient field with the magnet itself. Existing attempts to minimize this interaction include the use of conducting metal screening sleeves. However, induced currents in these sleeves or in the heat shield of the magnet decay with uncontrolled relaxation times which make it difficult or even impossible to implement some of the faster and more efficient NMR imaging methods. This is because the decaying current produces image fields superimposed on the desired gradient field. This uncontrolled time dependence introduces phase artefacts which can completely ruin the image.

In order to provide adequate access for patients, and to improve gradient uniformity, it is desirable to maximize the diameter of the magnetic field gradient coils in an NMR imaging machine. However, this often causes the coils to be close to other conductors, either the surfaces of cryogenic vessels (in superconducting magnet systems), electromagnetic coil supports (in resistive magnet systems), or ferromagnetic pole pieces (in ferromagnetic systems). When gradients are switched rapidly, as with many imaging techniques, eddy currents are induced in these conductors which then contribute additional field gradients varying in time and potentially very non-uniform in space. Typical time constants for the decay of the eddy currents vary from a few milliseconds to hundreds of milliseconds, depending on the type of main magnet and the specific coil configuration.

The commonest solution to this problem is to tailor the input applied to the amplifiers generating the gradient coil currents in such a way that the gradient fields themselves follow the prescribed time variation. The input voltage and gradient coil currents are characteristically over-driven for the initial part of the on-period of the gradient. But this remedy has a major disadvantage. If the gradient coils are placed close to the coupled surfaces, so that the eddy current field gradients may have the same uniformity as the desired gradient, the gradient coils become very inefficient and a large over capacity in the gradient current amplifiers is required, since the 'reflected' fields will be large and in the opposite sense from the desired fields. If, on the other hand, the gradient coils are reduced in size, to avoid the amplifier capacity problem, then the reflected gradient fields will in general be non-linear over the region of interest. Furthermore, in either case there are likely to be reflected fields from more distant conductors in the main magnet structure, each with its distinct time constant and spatial variation.

The only effective solution is in some way to reduce the gradient fields to zero at a finite radius outside be coupled to them.

Partially effective methods for magnetic screening in specific coil geometries have been proposed hitherto in particular U.S. Pat. Nos. 3,466,499 and 3,671,902. These geometries are not generally useful in NMR and NMR imaging.

SUMMARY OF THE INVENTION

It is an object of the invention to provide more efficient and effective magnetic field screens for coil geometries useful in NMR and NMR imaging.

It is a further object of the invention to provide efficient magnetic field screens for any coil design.

It is a still further object of the present invention to provide magnetic field screens for any desired component or components of a magnetic field.

According to the invention a screen for a magnetic field comprising a set of electrical conductors and means for supplying the conductors of the set with electrical currents of magnitude such that (a) the resultant current distribution approximates to the induced current distribution in a hypothetical continuous superconductive metal surface positioned in the place of said set so as to appear as a complete reflector of magnetic field, and (b) the resultant current distribution in this or other screens behaves alone or in a combination with said other screens in such a way as to appear to selectively reflect and/or transmit desired components of magnetic fields of specific configuration through said screen or screens.

Preferably the current distribution localized to the surface of a hypothetical conducting sheet or sheets is determined by the deconvolution of the magnetic field response function of the unit line elements of that current with the field to be screened; such problems being most conveniently solved in reciprocal space, which is defined by those co-ordinates conjugate to real space used in appropriate integral transform.

More preferably the problems are solved in Fourier space which is a particular example of reciprocal space.

The present invention also provides a method of designing a screening coil for selectively screening the field of a magnetic coil.

The present invention further provides a gradient coil system for use in NMR apparatus including a main coil designed to provide a gradient field and a screen coil surrounding the main coil.

In one preferred arrangement the conductors of the set are regularly spaced apart from each other. They may be connected electrically in parallel and have different values of resistance in order to produce the desired current distribution. In embodiments of the invention the different values of resistance of the conductors may be produced by different thicknesses of the respective conductors or constructing them with different compositions having appropriate values of electrical resistivity.

In alternative preferred arrangements the conductors of the set carry equal currents but are spaced apart from each other by different spacings so as to produce the desired current distribution.

It is a further object of the present invention to reduce acoustic vibration in MR gradient coils by using the active screening hereinbefore described.

In examples of carrying out the above invention a set of conductors are arranged on a cylindrical former and with appropriate spacing can be fed with equal currents. The spacing of the conductors of the set and the magnitude of the currents are calculated using the currents induced in a flat superconductive screen as the starting point.

Additionally according to this invention the theoretical current distribution in a continuous superconductive cylindrical shield positioned in the place of the aforementioned set of electrical conductors is calculated. Such a calculation enables an improved screen to be provided, especially where a cylindrical screen is required.

The calculations described herein represents an analytical formulation of the problem, enabling a fully general calculation of the current density in a cylinder required to cancel outside the cylinder the magnetic fields generated by coils inside. The results obtained are firstly applied to passive shielding, using a thick high-conductivity or superconductive cylindrical tube to solve the reflected fields problem without sacrificing gradient uniformity. The conclusions arrived at can then be applied to active shielding; the calculated current densities within the skin depth of a thick cylinder or in a superconducting cylinder are mimicked using a suitable arrangement of a set of wires supplied with currents of appropriate magnitude.

For passive shielding using a normal conducting cylinder to be effective, the skin depth $\sigma$ in the shield at the lowest frequency represented in the particular gradient switching sequence must be much smaller than the thickness d of the wall of the cylinder. For an echo planar switched gradient, for instance, with a fundamental frequency of 1 KHz, this entails a wall thickness of $\sim 10$ mm of aluminium. For switched gradients such as that used for slice selection, where there is a non-zero d.c. component of the fields at the cylinder surface, passive shielding is not appropriate.

When the criterion of $\sigma/d << 1$ is met, the time dependence of reflected fields will be identical to that of the applied field, and it is only the spatial nonuniformity of the net magnetic field which is of concern. Analytic calculation of the ensuing fields enables the necessary corrections to coil spacings to be made.

By Lenz's law, a magnetic field screen constructed in accordance with the above design criteria produces a magnetic field which opposes the field generated by the primary magnetic coil that it is designed to screen. For a given current in the primary coil the resultant magnetic field generated within the volume embraced by the coil is reduced and its spatial variation is also changed by the presence of the screen currents thus introducing undesirable variations in the primary field.

It is therefore a further object of the invention to provide a screening coil arrangement in which the above disadvantages are overcome.

Accordingly the present invention also provides a magnetic coil surrounded by two active magnetic screening coils, namely an inner screen and an outer screen, each respective screen comprising a set of electrical conductors and means for supplying the conductors of the set with electrical currents of magnitudes such that there is no appreciable magnetic field outside the outer screen and the field within the inner screen substantially corresponds to the field that would be provided by the said magnetic coil if the screens were not present.

BRIEF DESCRIPTION OF THE DRAWING

In order that the invention may be more fully understood reference will now be made to the accompanying drawings in which:

FIG. 22 illustrates diagrammatically the magnetic field produced by an unscreened primary coil in the form of a single hoop;

FIG. 23 illustrates the same hoop with a double screen embodying the invention;

FIG. 24 is a graph showing the magnetic field at different radial positions that is produced by the FIG. 23 arrangement;

FIGS. 26 to 33 illustrate ways of providing varying current distribution over a desired area;

DETAILED DESCRIPTION OF THE INVENTION

Figure 1:
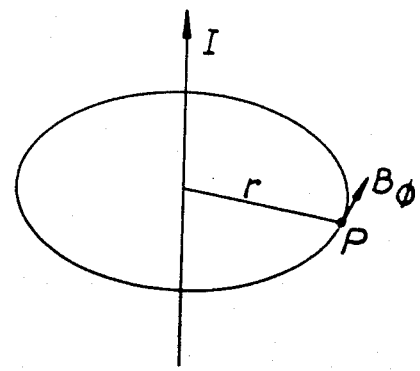
FIGS. 1 to 10 are explanatory of the underlying theory.

The basic theory and ideas are developed from the simple case of an infinite straight wire parallel to an infinite flat conducting sheet. FIG. 1 shows a long straight wire carrying a current I. The magnetic field $B_o$ at a point P which is at a distance r normal to the wire is given by $$B_\phi = \left(\frac{\mu_0}{4\pi}\right)\frac{2I}{r} \qquad (1)$$

Figure 2:
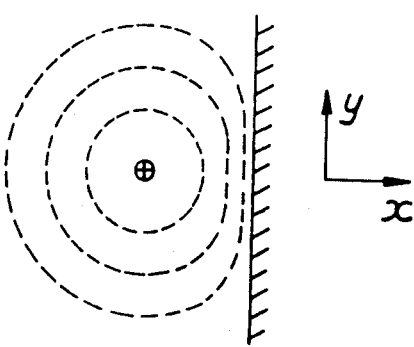

If the current is changing with angular frequency $\omega$ and the wire is near to an infinite conducting sheet as shown in FIG. 2 (also if the current is static and the sheet is superconducting), the magnetic field undergoes distortion at the metal surface. Let us assume no field penetration into the screen, i.e. the angular frequency $\omega$ and the metal conductivity $\sigma$ are sufficiently high, then the boundary conditions for the magnetic field at the surface are $$B_x = 0 \qquad (2)$$
$$B_y = B_y$$
$$B_z = 0$$

Figure 3:
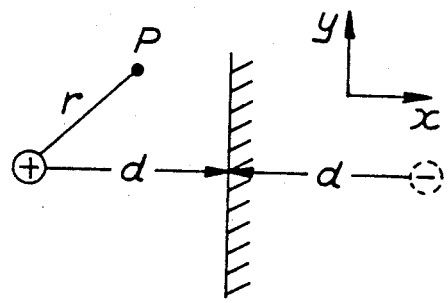

The details of the field at a point P due to a wire at a distance d from the sheet may be conveniently calculated as shown in FIG. 3 using the method of images which assumes a wire at a distance d from the other side of the sheet carrying a current $-I$.

Figure 4:
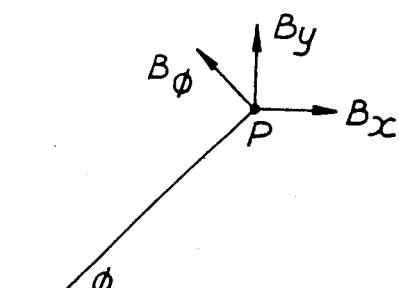

In general, current in the sheet surface is directly related to the tangential field $H_y$. The total field $B_o$ at P, FIG. 4, is given by Equation (1) and may be resolved into components $B_x$ and $B_y$ in the x and y directions respectively $$B_y = \left(\frac{\mu_0}{4\pi}\right)\frac{2I}{r}\cos\phi \qquad (3)$$

$$B_x = \left(\frac{\mu_0}{4\pi}\right)\frac{2I}{r}\sin\phi \qquad (4)$$

Figure 5:
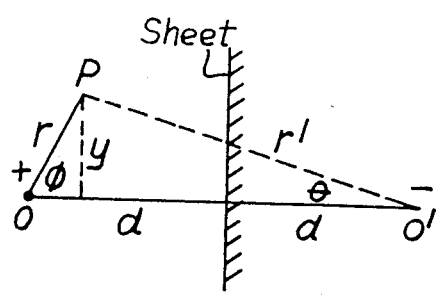

Taking the image current $-I$ into account, FIG. 5, we obtain the total y direction field $B_{TOT}$ at point P for a current I at point 0 and its image current $-I$ at a point 0'.

$$B_{TOT} = B_y + B_y^{image} \qquad (5a)$$

$$= \left(\frac{\mu_0}{4\pi}\right)2I\left[\frac{\cos\phi}{r} - \cos\left(\frac{180-\phi}{r'}\right)\right] \qquad (5b)$$

We also note from FIG. 5 that $$y = r\sin\phi = r'\sin\theta \qquad (6)$$

and $$r\cos\phi + r'\cos\theta = 2d \qquad (7)$$

Figure 6:
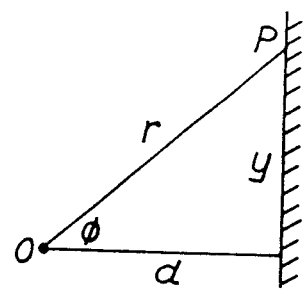

If P is on the conducting sheet surface $r = r'$ in which case, see FIG. 6.

$$B_y = \left(\frac{\mu_0}{4\pi}\right)\frac{4I}{r}\cos\phi \qquad (8)$$

-continued $$r^2 = d^2 + y^2 \qquad (9)$$

From Equations (9) and (10) we obtain $$B_y = \left(\frac{\mu_0}{4\pi}\right)4I\frac{d}{d^2 + y^2} \qquad (11)$$

Figure 7:
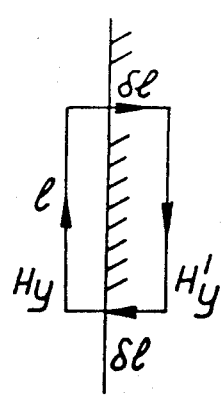

Consider now the line integral of the magnetic field in and close to the metal surface, FIG. 7. By Ampere's theorem we have $$\int H_y \cdot dl = \int J_y \cdot ds \qquad (12)$$

where $J_y$ is the surface current density and ds an area element and dl a path element. For a short path l parallel to the surface $H_y$ is constant. The line integral is therefore $$H_y l - y'l + (H_x + H_x')dl = J_y l \qquad (13)$$

But in the metal $H_y' = 0$ and $H_x = H_x'$ yielding for $dl \to 0$ $$H_y = J_y \qquad (14)$$

The surface current distribution is therefore $$J_y = \left(\frac{1}{4\pi}\right)\frac{4Id}{d^2 + y^2} = J_1(d) \qquad (15)$$

Figure 8:
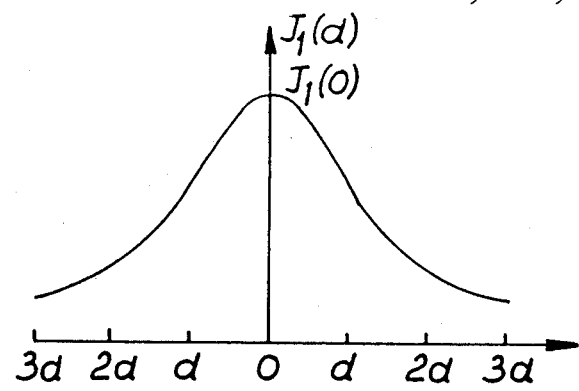

This function is plotted in FIG. 8.

Figure 9:
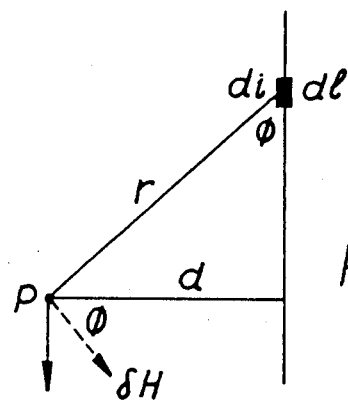

To determine the field produced by the surface current density distribution, let us assume we have a surface distribution $J_y$ within a flat metal sheet as in Equation (15). Consider an element of surface dl with current $\sigma i$, FIG. 9. This current is given by $$\delta i = \left(\frac{1}{4\pi}\right)\frac{4Id}{d^2 + y^2}dy \qquad (16)$$

The elemental field at point P which is a distance r from the element and distance d from the sheet is $$\delta H = \frac{\delta i}{2\pi r}, \qquad (17)$$

The tangential component of which is:

$$\delta H = \frac{\delta i}{2\pi r}\sin\phi = \frac{\delta i}{2\pi}\frac{d}{r^2} \qquad (18)$$

$$= \frac{2Id^2}{\pi}\left(\frac{1}{4\pi}\right)\frac{dy}{(d^2 + y^2)^2} \qquad (19)$$

The total field is $$H_y = 2\int_0^\infty \frac{2Id^2}{\pi}\left(\frac{1}{4\pi}\right)\frac{dy}{(d^2 + y^2)^2} \qquad (20)$$

which yields $$B_y = \frac{I}{j}\left(\frac{\mu_0}{4\pi}\right) \qquad (21)$$

Thus the field at point P distance d from the surface current distribution is equivalent to a mirror current of $-I$ at distance 2d from P.

The total surface current $$I_y = \int_{-\infty}^{\infty} J_y dy = I \qquad (22)$$

Figure 10:
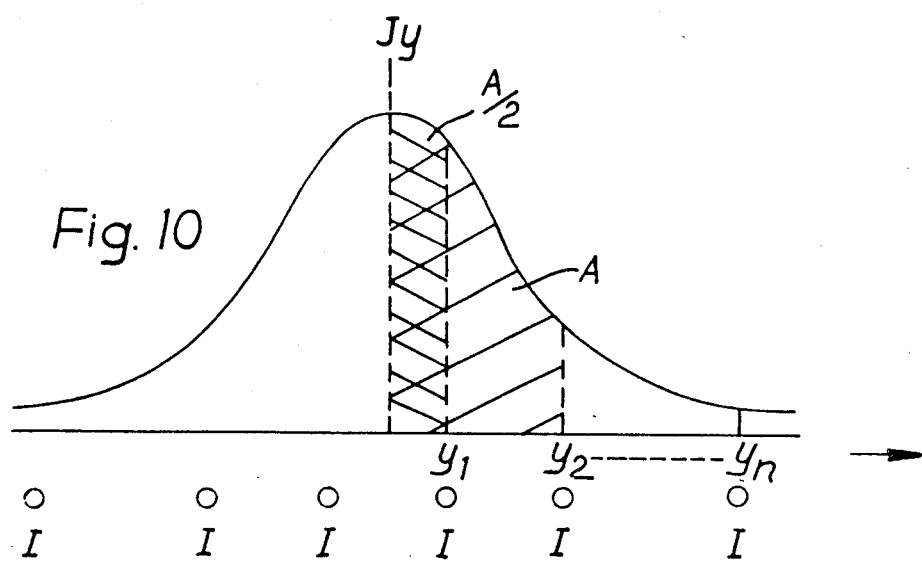

The results derived above suggest that instead of using a metal plate to screen alternating fields, an active screen comprising a mesh of wires may be used in which a current pattern is externally generating to mimic a desired surface distribution. This situation is shown in FIG. 10. Wires at positions $y_1, y_2 \ldots y_n$ in the y direction all carrying an equal current I are spaced at different discrete intervals corresponding to equal areas A under the $J_i$ curve of FIG. 8. For equal currents in the wires, the wires must be unequally spaced with positons $y_n$ which satisfy the relationship $$(n + \tfrac{1}{2}) = \frac{2N}{I}\int_0^{y_n} J_1(y)dy \qquad (23a)$$

for an even array of 2N wires spread about the y origin. For an odd array of 2N+1 wires with one wire at the origin we have $$n = \frac{(2N + 1)}{I}\int_0^{y_n} J_1(y)dy \qquad (23b)$$

where $n = 1, 2, 3 \ldots$

Alternatively, wires may be equally spaced with different currents chosen such that $$I_n = \int_{(n-1)\Delta y}^{n\Delta y} J_1(n\Delta y)dy \qquad (24)$$

Figure 11:
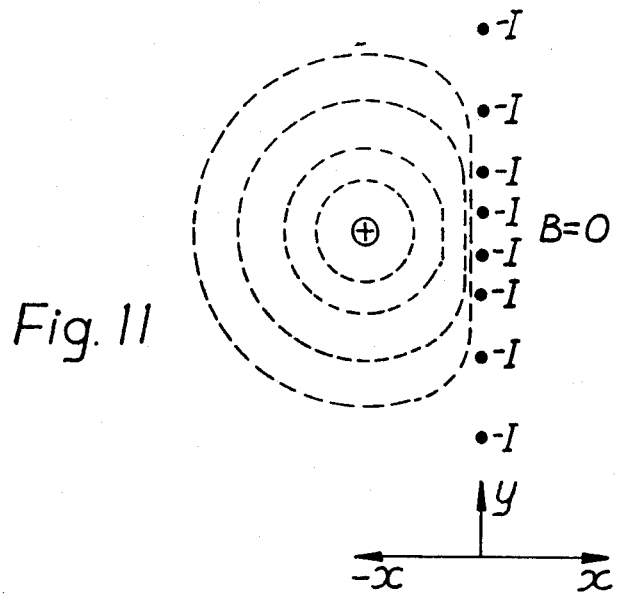
FIGS. 11, 12, 13, 14, 15, 16a, 16b, 17a, and 17b illustrate in diagrammatic form various embodiments of the invention.

In either case, since we have arranged to satisfy the original boundary conditions on the surface of a fictitious plate, the magnetic field in the half plane $(x, \pm y)$ approaches zero. The degree of screening depends ultimately on the number of wires used in the active screening mesh. An example of such an active screen is shown in FIG. 11 for a distribution of current carrying conductors corresponding to FIG. 10 all carrying an equal current I. The field B on the opposite side of the screen is effectively zero.

Figure 12:
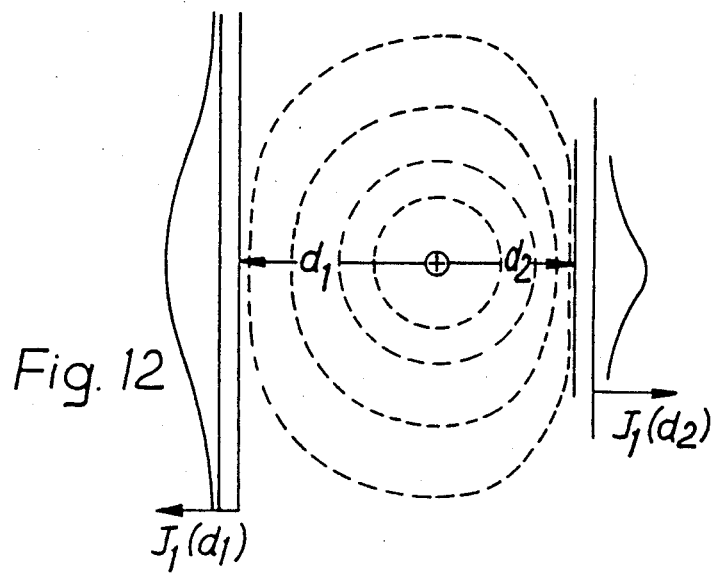
Figure 13:
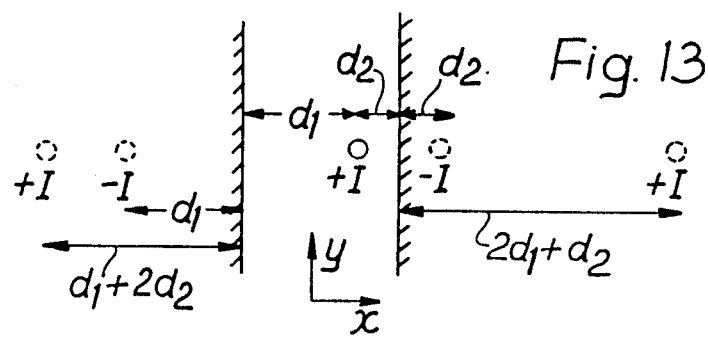

If two parallel screens are used, each will have primary current distributions of $J_1(d_1)$ and $J_1(d_2)$ given by Equation (15). This is shown in FIG. 12. However, each induced current distribution will induce further changes in the distribution in the opposite plate represented by additional terms $J_n(d_n)$. This is equivalent to a set of multiple reflections, FIG. 13, which correspond to an infinite set of images. When $d_1 = d_2 = d$, image currents occur at $x = \pm 2nd$, $n = 1, 2 \ldots$ The total induced surface current in each sheet is the sum of $$J(d) = \sum_n J_n(d_n).$$

The boundary conditions at the metal surface ensure that the normal laws of reflection apply. However, when active current screens are used, the reflection laws may be selectively changed to reflect any images using the $J_n(d)$'s corresponding to particular distances d.

Figure 14:
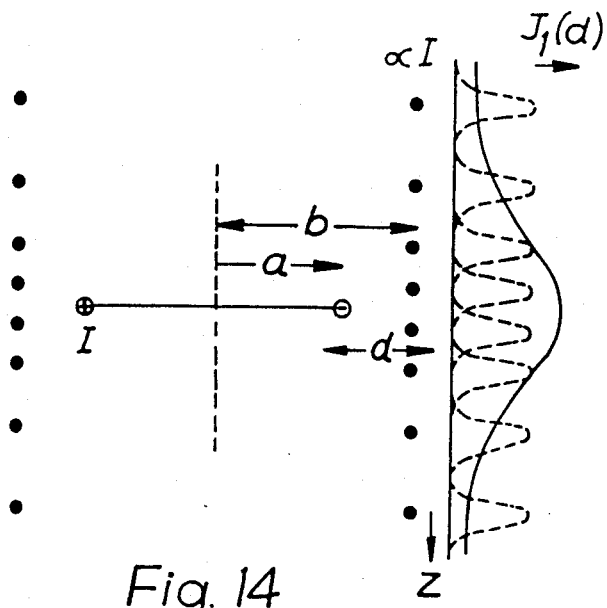

An example of a gradient active screen is shown in FIG. 14 for a single circular hoop of diameter 2a. Let this be screened by an active current mesh in the form of a cylinder of radius a+d. In a metal cylinder, image hoops appear at radii $r = b+d, 3b\pm d, 5b\pm d$, etc. However, since the effect of these distant images diminishes quite rapidly, it is reasonable to approximate a screen with $J_1(d)$ corresponding to the plane sheet case, Equation (15). Better approximations may be obtained by an iterative numerical approach. Although exact solutions for the surface current in a cylinder exist, when actual wire screens are constructed, the numerical approach is preferred since it automatically takes account of the finite number of wires and their discrete spacing. The screen current is $$N_2 I_2 = -\left(\frac{r_1}{r_2}\right)^2 \cdot aN_1 I_1$$

where $N_2$ is the number of screen wires in the mesh of radius $r_2$ each carrying a current $I_2$ and $N_1$ is the number of turns in the primary coil radius $r_1$ carrying a current $I_1$. The factor $\alpha$ is of the order of unity and is chosen to optimize the screening. The whole optimization procedure is accomplished by a computational process which generalizes to applying minimization of the total field over a limited region of space. Mathematically this is conveniently achieved by a least squares method. For practical ease, it is desirable to have both coil and screen driven from the same current source. Since the total screen current is less than the primary current it will in general be necessary to take parallel combinations of the screen mesh so that the total system may be driven in series. However, a parallel arrangement is also possible in which the screen wires are varied in resistance and/or impedance in such a way that when driven from a voltage source appropriate currents flow. Because of the screening effect the inductance of both versions of the coil system should be low.

Figure 15:
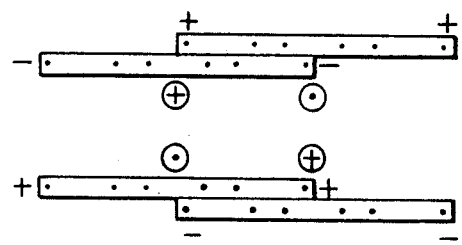
Figure 15:
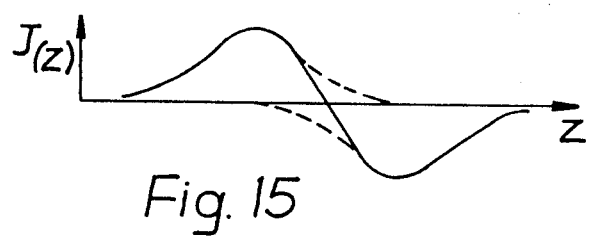

Sets of screened hoops may be used to construct screened magnets producing uniform magnetic fields. The presence of the screen around one hoop is approximately equivalent to an image hoop with negative current producing an opposing field. For a Helmholtz coil pair the intercoil spacing equals the coil radius a. When screened, however, the spacing must be changed so as to make the second derivative of the field $B_z$ with respect to z vanish for the combined coil system. Similarly for a Maxwell pair designed to produce a linear magnetic field gradient, the intercoil spacing is ideally a $\sqrt{3}$. This is shown in FIG. 15. The two hoops forming a Maxwell pair are screened by a concentric pair of screening meshes offset axially from each other. The combined screen current distribution is also shown. Again, however, when screened coils are used, a new spacing obtains which makes the third derivative of $B_z$ with respect to z vanish for the total coil system. The process of optimization of coil geometry can be done analytically for simple coil structures as discussed above. For more complicated systems such as screened saddle geometry gradient coils, it is preferable simply to find by computational means the position where the chosen derivative vanishes, or is minimized.

For NMR imaging sytems using superconducting magnet coils it is convenient to use saddle coils to produce the transverse gradients $$\frac{\partial B_z}{\partial x} \text{ and } \frac{\partial B_z}{\partial y}.$$

Figures 16A, 16B:
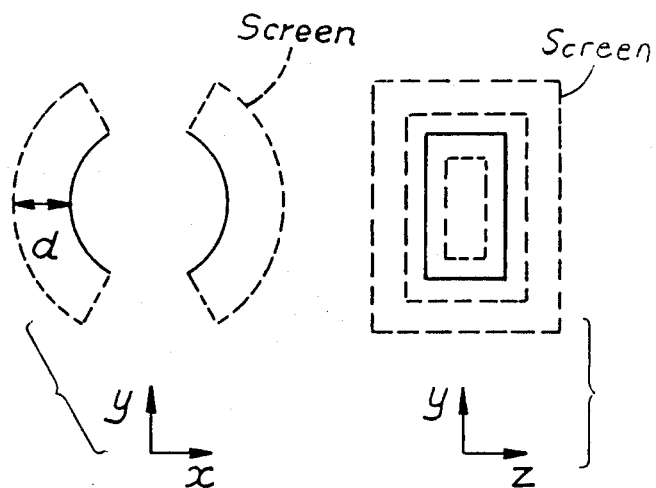

In some imaging techniques, at least one of the gradients can be very large making interaction with the main magnet potentially serious. FIG. 16 shows one half of a $G_x$ screened gradient coil system. A screened single saddle coil is shown in end view at (a) and plan view at (b). The dotted lines correspond to the screening mesh. To a first approximation, the screen current profile is $J_1(d)$. Better screening may be obtained by an iterative procedure which minimizes the field outside the screen.

Figure 17A:
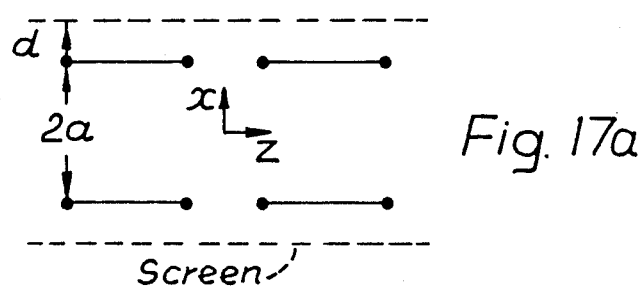
Figure 17B:
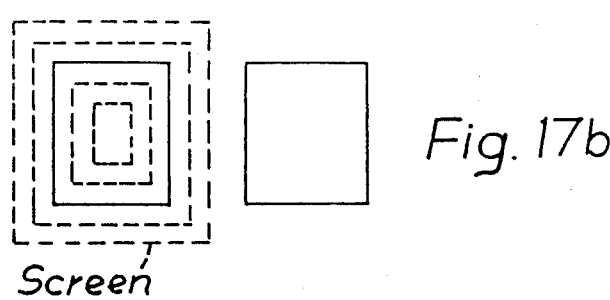

FIG. 17 shows a screened rectangular $G_x$ gradient coil set with ½ screen. Again, if a d<<2a, $J_1(d)$ may be used as a good approximation for the screen current distribution. For better results other reflections can be included or the iterative procedure used to minimize fields outside the coil.

NMR imaging systems require rf coil systems to deliver rf pulses to the specimen and to receive signals induced in the sample. Because of the number of other coil systems required for field gradients, there is always a problem of space. With normal rf coil arrangements the field outside the coil drops off rather slowly. In order to minimize coil interactions which can lower the Q value, rf coil diameters are often chosen to be around 0.5 to 0.7 of the gradient coil diameter. With shielded rf coil designs, it may be possible to utilize more of the available space without loss of performance.

A systematic procedure for reducing extraneous magnetic fields outside the active volume of static magnets, field gradient coil systems and rf coils has been described. In NMR imaging, reduction of stray fields in all three types of coil structure is extremely important. The method utilizes active magnetic screens and has the advantage that such screens operate independently of frequency down to dc. Some price is paid in terms of reduction of field in the active volume compared with that of the free space value. With time dependent gradients, the price is in general acceptable since for fast NMR imaging schemes employing rapid gradient switching, active coil screening may be the only way in which such imaging schemes may be made to operate in the relatively close confines of an electromagnet.

Figure 18:
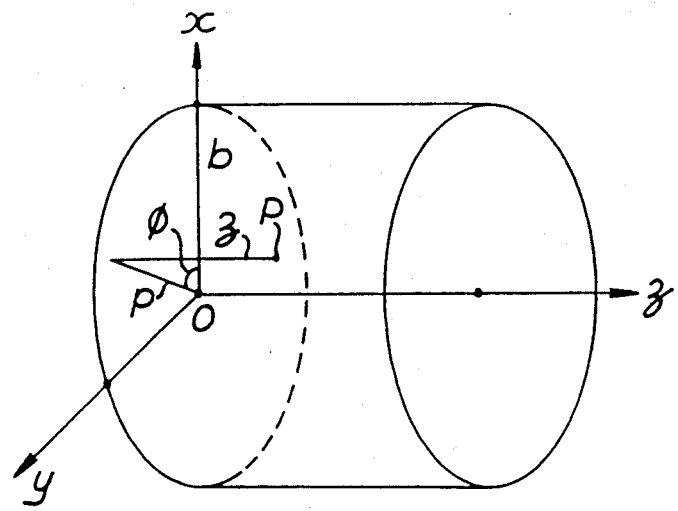
FIG. 18 shows a cylindrical co-ordinate system used in calculating the magnetic fields produced by current flow on a cylindrical surface.

In what has previously been described, iterative and least squares approximation methods are used to obtain actual screening wire positions. It is possible to obtain these positions directly using analytical methods. If the gradient coils and screens are located on cylindrical formers, it is natural to use cylindrical co-ordinates $\rho, \phi, z$ in order to retain the symmetry of the system. The z axis is taken to lie along the axis of the cylinder as shown in FIG. 18.

The vector potential A, is used to describe the magnetic field. This has the components $A_\rho, A_\phi, A_z$ given by $$A_\rho = \frac{\mu_0}{4\pi} \int \frac{J_{\phi'}(r)dv' \sin(\phi - \phi')}{|r - r'|} \quad (25)$$

$$A_\phi = \frac{\mu_0}{4\pi} \int \frac{J_{\phi'}(r')dv' \cos(\phi - \phi')}{|r - r'|} \quad (26)$$

$$A_z = \frac{\mu_0}{4\pi} \int \frac{J_z(r') dv'}{|r - r'|} \quad (27)$$

where J is the current density and dv' is a volume element corresponding to the position vector r'. There is no current flow in the radial direction in many problems of interest so J has only z and $\phi$ components.

It has been assumed that currents induced in the shield are confined to the surface of a cylinder of radius b. The gradient coils to be shielded are mounted on a cylindrical former of radius a which is coaxial with the shield. The currents can then be written as $$J = F(z,\phi)\delta(\rho - a) + f(z,\phi)\delta(\rho - b) \quad (28)$$

where F describes the current in the gradient coils, f describes the current induced in the shield and $\delta$ is the Dirac delta function. It is possible to derive relationships between F and f from the condition that the radial component of the magnetic field is zero on the surface of the shield. The other constraint which is used is the equation of continuity, which, in the absence of charge accumulation is $$\nabla \cdot J = 0 \quad (29)$$

The vital step in the analytic treatment of this system is the use of the Green's function expansion $$\frac{1}{|r-r'|} = \quad (30)$$

$$\frac{1}{\pi} \sum_{m=-\infty}^{\infty} \int_{-\infty}^{\infty} dk \, e^{im(\phi-\phi')} e^{ik(z-z')} I_m(k\rho_<) K_m(k\rho_>)$$

where m is an integer and $\rho_<(\rho_>)$ is the lesser (greater) of $\rho$ and $\rho'$, and $I_m(z)$ and $K_m(z)$ are modified Bessel functions. To use equation (30) in equations (25), (26) and (27) it is helpful to define a type of Fourier transform of f and F as follows:

$$f_z^m(k) = \frac{1}{2\pi} \int_{-\pi}^{\pi} d\phi \, e^{-im\phi} \int_{-\infty}^{\infty} dz \, e^{-ikz} f_z(\phi, z) \quad (31)$$

$$f_\phi^m(k) = \frac{1}{2\pi} \int_{-\pi}^{\pi} d\phi \, e^{-im\phi} \int_{-\infty}^{\infty} dz \, e^{-ikz} f_\phi(\phi, z) \quad (32)$$

where the quantities $F_z^m(k)$ and $F_\phi^m(k)$ are defined in an analogous way. The components of A thus become (e.g. for $\rho > b$):

$$A_z = \quad (33)$$

$$\frac{\mu_0}{2\pi} \sum_{m=-\infty}^{\infty} \int_{-\infty}^{\infty} dk \, e^{im\phi} e^{ikz} K_m(k\rho) [bI_m(kb)f_z^m(k) + aI_m(ka) F_z^m(k)]$$

$$A_\phi = \quad (34)$$

-continued $$\frac{\mu_0}{4\pi} \sum_{m=-\infty}^{\infty} \int_{-\infty}^{\infty} dk\, e^{im\phi} e^{ikz} [b(I_{m-1}(kb)K_{m-1}(k\rho) +$$

$$I_{(m+1)}(kb)K_{m+1}(k\rho))f_\phi{}^m(k) + a(I_{m-1}(ka)K_{m-1}(k\rho) +$$

$$I_{m+1}(ka)K_{m+1}(k\rho))F_\phi{}^m(k)]$$

$$A_\rho = \tag{35}$$

$$\frac{-i\mu_0}{4\pi} \sum_{m=-\infty}^{\infty} \int_{-\infty}^{\infty} dk\, e^{im\phi} e^{ikz} [b(I_{m-1}(kb)K_{m-1}(k\rho) -$$

$$I_{(m+1)}(kb)K_{m+1}(k\rho))f_\phi{}^m(k) + a(I_{m-1}(ka)K_{m-1}(k\rho) -$$

$$I_{m+1}(ka)K_{m+1}(k\rho))F_\phi{}^m(k)]$$

Similar expressions can be obtained when $\rho < a$ or $a < \rho < b$.

Now let the boundary condition that the radial component of the negative field $B\rho = 0$ at $\rho = b$ be applied. This is equivalent to $$\frac{1}{b} \frac{\partial A_z}{\partial \phi}\bigg|_{\rho=b} = \frac{\partial A_\phi}{\partial z}\bigg|_{\rho=b} \tag{36}$$

Equations (33) and (34) are now used and terms varying as $e^{im\phi}$ are equated. This gives $$\frac{2m}{bk} K_m(kb)[bI_m(kb)f_z{}^m(k) + aI_m(ka)F_z{}^m(k)] = \tag{37}$$

$$f_\phi{}^m(k)b[I_{m-1}(kb)K_{m-1}(kb) + I_{m+1}(kb)K_{m+1}(kb)] +$$

$$F_\phi{}^m(k)a[I_{m-1}(ka)K_{m-1}(ka) + I_{m+1}(ka)K_{m+1}(ka)]$$

This equation can be simplified using the relations derived from the equations of continuity, $$\frac{1}{b} \frac{\partial f_\phi}{\partial \phi} = -\frac{\partial f_z}{\partial z} \tag{38}$$

for the currents in the shield, and $$\frac{1}{a} \frac{\partial F_\phi}{\partial \phi} = -\frac{\partial F_z}{\partial z} \tag{39}$$

for the currents in the gradient coils. These equations are equivalent to $$f_\phi{}^m(k) = -\frac{kb}{m} f_z{}^m(k) \tag{40}$$

and $$F_\phi{}^m(k) = -\frac{ka}{m} F_z{}^m(k) \tag{41}$$

The recurrence relations for Bessel functions are also used, from which can be derived the identity $$I_{m-1}(z_1)K_{m-1}(z_2) + I_{m+1}(z_1)K_{m+1}(z_2) + \tag{42}$$

$$(2m^2/z_1 z_2) I_m(z_1)K_m(z_2) = -2I_m'(z_1)K_m'(z_2)$$

Here the prime denotes the derivative. Equations (37), (40), (41) and (42) can be combined to obtain the elegant expressions, $$f_z{}^m(k) = -F_z{}^m(k) \frac{a^2 I_m'(ka)}{b^2 I_m'(kb)} \tag{43}$$

$$f_\phi{}^m(k) = -F_\phi{}^m(k) \frac{a\, I_m'(ka)}{b\, I_m'(kb)} \tag{44}$$

These identities provide the means of calculating fields due to any combination of currents constrained to flow on the surface of a cylinder inside a conducting shield. This will now be illustrated with an example.

Figure 19:
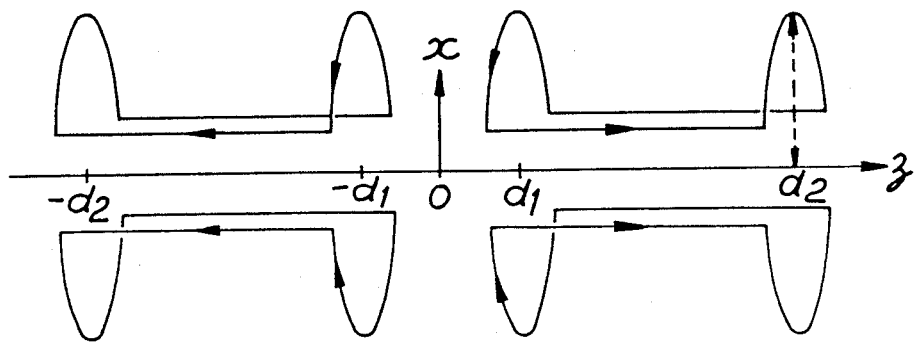
FIG. 19 illustrates saddle-shaped coils used as magnetic gradient field coils.

For transverse field gradients it is common to use a saddle coil configuration such as shown in FIG. 19. Two pairs of saddle coils are shown. One pair extends between $-d_1$ and $-d_2$ along the z axis. The other part extends between $+d_1$ and $+d_2$ along the z axis. With energization of the coils as marked a gradient field is produced in the form of a magnetic field along the z axis which has a gradient in the x direction. The field produced by such coils extends widely outside the cylinder on which the coils are wound unless they are shielded by a conductive sleeve.

For the standard coil geometry with 120° arcs for the saddle coils.

$$F_\phi(\phi,z) = I \{\delta(z - d_1) + \delta(z + d_1) - \delta(z - d_2) - \tag{45}$$

$$\delta(z + d_2)\} \left\{ H\left(\phi + \frac{\pi}{3}\right)\left(1 - H\left(\phi - \frac{\pi}{3}\right)\right) - \right.$$

$$\left. H\left(\phi - \frac{2\pi}{3}\right)\left(1 - H\left(\phi + \frac{2\pi}{3}\right)\right) \right\}$$

where $H(x)$ is the Heaviside step function. This has the Fourier transform $$F_\phi{}^m(k) = \frac{2\sin(m\pi/3)}{m\pi} I (\cos(kd_1) - \cos(kd_2)) \times (1 - e^{im\pi}) \tag{46}$$

This is zero for m even or an integer multiple of 3. This leaves non-zero terms for m=1, 5, 7, 11 etc.

The position of the screening arcs can now be determined as follows. First it is necessary to specify the continuous current distribution to which the arcs approximate as set out in equations (43) and (44).

The actual surface current density may then be written $$\frac{f_\phi(\phi,z)}{I} = -\frac{8}{\pi^2} \frac{a}{b} \sum_{m=1,5,7} \frac{\sin \frac{m\pi}{3}}{m} \cos m\phi \int_0^\infty \cos kz\, dk (\cos kd_1 - \cos kd_2) \frac{I_m'(ka)}{I_m'(kb)} \tag{47}$$

and $$\frac{f_z(\phi,z)}{I} = -\frac{8}{\pi^2}\frac{a}{b}\sum_{m=1,5,7}\sin\frac{m\pi}{3}\sin m\phi \int_0^\infty \sin kz\, dk\frac{(\cos kd_1 - \cos kd_2)}{bk}\frac{I_m'(ka)}{I_m'(kb)} \quad (48)$$

The next step is to determine the stagnation point of this current density, that is, the point $S=(O,d)$ at which $F_\phi$ and $f_z$ are both zero, around which the surface current flows. By symmetry this occurs at $\phi=0$, and since $f_z(O, z)=0$ for all z, it may be found by solving $f_\phi(0, z)=0$, by successive approximation.

Having found S, the integrated surface current $I_t$ crossing the line SP between S and an arbitrary point P on the cylinder (FIG. 20) is given by $$I_t(\phi,z) = \int_0^z f_\phi(0,z)dz - b\int_0^\phi f_z(\phi,z)d\phi \quad (49)$$

(using the surface version of the divergence theorem). Hence $$\frac{I_t(\phi,z)}{I} = -\frac{8}{\pi^2}\frac{a}{b}\sum_{m=1,5,7}\frac{\sin\frac{m\pi}{3}}{m}\int_0^\infty dk\frac{(\cos kd_1 - \cos kd_2)}{k}\frac{I_m'(ka)}{I_m'(kb)} \times (\sin kz \cos m\phi - \sin kd) \quad (50)$$

The contours of the induced surface current may now be found by setting $I_t(\phi, z) =$ constant. These may be translated into positions of screening arcs in the following way. The total current in the cylinder $I_t(0, 0)$ is divided by 2N, where N is the number of screening arcs required, and the M'th arc consists of the contour where $$I_t(\phi,z) = \frac{I_t(0,0)}{2N}(2M - 1) \quad (51)$$

In practice $I_t(\phi, z)$ is calculated over a grid of $50\times 45$ points, and the contours are found by linear interpolation between the calculated points.

To check that these arcs indeed provide adequate screening of saddle coil fringe fields, the total field can be calculated using the Biot-Savart Law, taking as line elements $d_1$ the intervals between successive calculated co-ordinate pairs along each arc.

Given a set of saddle, coils with radius 0.31 m and arc spacings from the center $d_1$ and $O_2$ of 0.108 m and 0.404 m, the shielding produced at 0.55 m radius, using six screening arcs on a cylinder of radius $b=0.45$ m, is as follows:

| | |
|---|---|
| Maximum unscreened field | $= 0.6 \times 10^{-6}$ T/A-turn |
| Maximum screened field ($z < 0.5$ m) | $= 0.2 \times 10^{-7}$ T/A-turn |
| Maximum screened field ($z < 1.0$ m) | $= 0.47 \times 10^{-7}$ T/A-turn |

For comparison, the maximum field at 0.55 m radius produced by an unscreened small scale saddle coil set ($a=0.16$ m, $d_1=0.56$ m, $d_2=0.206$ m) is $0.86\times 10^{-7}$ T/A-turn.

Figure 20:
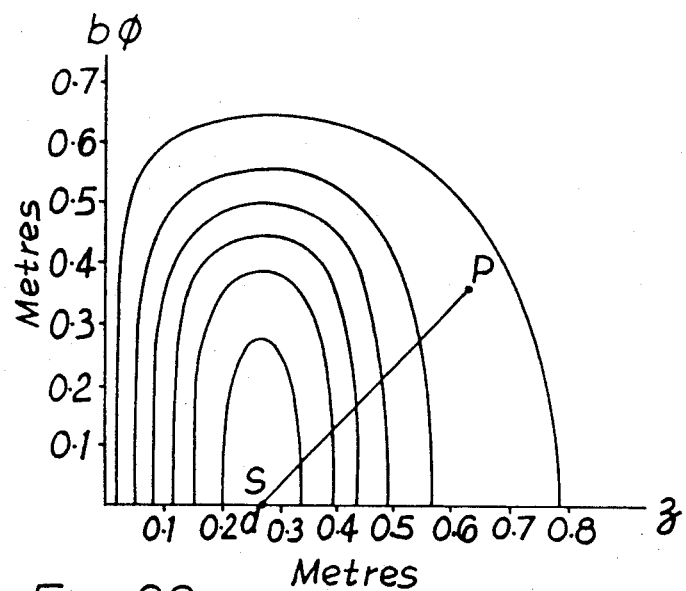
FIG. 20 illustrates the configuration of one octant of a set of screening coils in accordance with the calculations described herein.

FIG. 20 shows the configuration of one octant of the set of screening coils calculated above.

A larger number of screening arcs, or the use of foil rather than wire conductors, will further reduce the fringe fields.

Screening a set of saddle coils, the spacing of which has been optimized without the screen present, inevitably reduces the uniformity of the gradients produced. The uniformity may be recovered however by adjusting the arc spacing as follows:

The z component of the magnetic field can be derived from equations (34), (35), and (44) to give $$B_z = \quad (52)$$

$$\frac{\mu_0 a}{2\pi}\sum_{m=-\infty}^{\infty}\int_{-\infty}^\infty dk\, e^{im\phi}e^{ikz}kF_\phi^m(k)\left\{K_m'(ka) - \frac{K_m'(kb)I_m'(ka)}{I_m'(kb)}\right\}I_m(k\rho)$$

This becomes, with substitution of equations (45) and (46)

$$B_z = \quad (53)$$

$$-\frac{\mu_0 a}{\pi}\sum_{m=1,5,7,\ldots}\int_{-\infty}^\infty dk\, k\cos m\phi\cos(kz)\, I_m(k\rho) \times$$

$$\frac{4}{\pi}\frac{\sin(m\pi/3)}{m}I(\cos(kd_1) - \cos(kd_2))\left\{K_m'(ka) - \frac{K_m'(kb)\,I_m'(ka)}{I_m'(kb)}\right\}$$

It is now possible to optimize the gradient linearity by adjusting the arc positions of the saddle coils. The terms for $m=5$ are of fifth order in x, y or z, whereas there are terms for $m=1$ which are of first order in x and of third order in x, y and z.

The optimum choice of the parameters $d_1$ and $d_2$ is the one which removes the third order terms. This gives the condition $$\int_0^\infty dk\, k^4\, (\cos(kd_1) - \quad (54)$$

$$\cos(kd_2))\left\{K_1'(ka) - \frac{K_1'(kb)I_1'(ka)}{I_1'(kb)}\right\} = 0$$

There are now two unknown quantities, $D_1(=d_1/a)$ and $D_2(=d_2/a)$ and only one constraint, so it is not possible to give a unique choice of parameters. However it can be ensured that each parameter separately satisfies the equation $$\int_0^\infty dt\, t^4\cos(tD)\left\{K_1'(t) - \frac{K_1'(at)I_1'(t)}{I_1'(at)}\right\} \quad (55)$$

Figure 21:
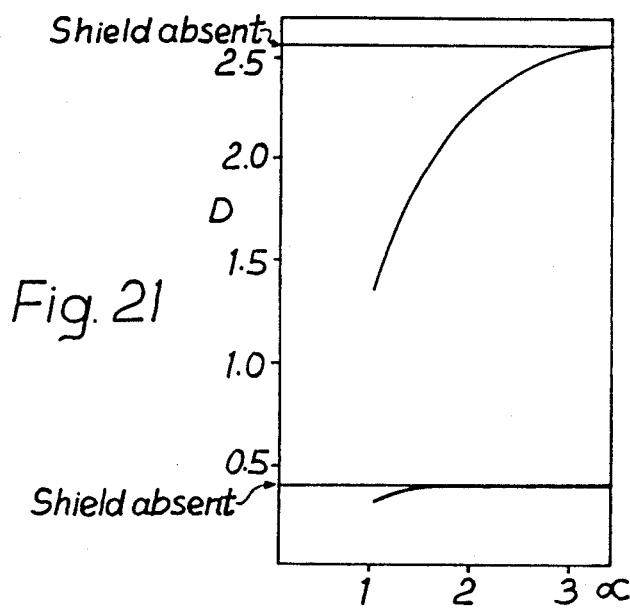
FIG. 21 shows curves for optimizing the positions of the arcs of the saddle coils of FIG. 19.

(with α=b/a) for this automatically satisfies equation (54). Values of $D_1$ and $D_2$ as a function of α are shown in FIG. 21.

It is possible to improve on this arrangement by altering $D_1$ and $D_2$ slightly (subject to the constraint given by equation (55)) and minimizing the fifth order terms. The final choice of values of $D_1$ and $D_2$ depend on whether the x or z variation is considered to be more important. The values of $D_1(\alpha)$ and $D_2(\alpha)$ shown represent an excellent starting point in the search for the optimum position of the saddle coils.

Referring now to FIG. 22 there is shown therein a magnetic coil in the form of a single wire hoop 1 of radius a carrying a current +I. In FIG. 23 the same wire hoop 1 is surrounded by two active magnetic screens S1 and S2. Each screen comprises a set of electrical current carrying conductors but for simplicity the screens are shown as sections of cylinders. Outer screen S1 is a cylinder of radius b and inner screen S2 is a cylinder of radius c.

With appropriate screen current density distributions screens S1 and S2 act together as a flux guide confining the field lines in the manner indicated. The design criteria for the current density distributions are set out below.

For a single conducting screen S, the boundary conditions of the magnetic field B(r-r') at the surface of the screen require only that the axial component $B_z$ (r-r', z'z') is considered which for a coaxial hoop is independent of azimuthal angle φ. For perfect screening it is required that $$I B_z(r-a,z) + B_z^s(R-b,z) = O \quad (56)$$

for r>b and for all z, where $B_z(r-a,z)$ is the primary hoop field per unit current and $B_z^s(r-b,z)$ is the total field generated by the screen. The screen field is the convolution of the surface current density $j_\phi(z)$ with the hoop magnetic field response per unit current. Equation (56) may therefore be written as $$I B_z(r-a,z) = -\int_{-\infty}^{\infty} B_z(r-b,z-z')j_\phi(z')dz' \quad (57)$$

Note that $$F_\phi^m(q) = J_\phi^m(q); F_z^m(q) = J_z^m(q)$$

$$f_\phi^m(q) = j_\phi^m(q); f_z^m(q) = j_z^m(q)$$

where q may be taken to be k or z. The spatial Fourier transform of equation (57) gives $$I B_z(r-a,k) = -B_z(r-b,k)j_\phi(k) \quad (58)$$

where k is the reciprocal space wave number.

Equation (58) may be generalized for two screens with current densities $j_\phi^1(k)$ and $j_\phi^2(k)$ as set out below. For zero field in the range r≧b and the unperturbed hoop field for r≦c there is obtained $$I B_z(r-a,k) = -B_z(r-b,k)j_\phi^1(k) - B_z(r-c,k)j_\phi^2(k) \quad (59)$$
for r≧b $$O = B_z(r-b,k)j_\phi^1(k) + B_z(r-c,k)j_\phi^2(k) \text{ for } r\leq c \quad (60)$$

The current hoop fields are evaluated numerically along the z-axis on the appropriate cylindrical surface using the Biot-Savart Law, then Fourier transformed to k-space. This allows numerical solution of the simultaneous equations (59) and (60) yielding the k-space current densities. These are then inversely transformed to yield the actual screen current density distributions.

In this example consider a primary hoop of radius a=0.5 m shielded by two active screens S1, S2 with radii b=0.75 m and c=1.0 m respectively. The hoop current is 1A. Using the computed distributions, the total magnetic field generated by the screen system in the hoop plane (z=0) is calculated as a function of r. This is shown in FIG. 24 which is a graph of a calculated z-component of magnetic field $B_z(r,0)$ against radius in the plane of a doubly screened flat current hoop of dimensions as in FIG. 23. The unscreened hoop field is shown by the broken curve and is equal to $B_z$ for r<0.75 m. As expected for r<c, the field $B_z$ exactly equals that of the unscreened hoop. For r>b, the field B is zero. Between the screens, the field is wholly negative. The total screen currents are given by $I_1 = j_\phi^1(0)$ and $I_2 = j_\phi^2(0)$. In this case $I_2 = -I_1 = 0.57$ I. The results have been produced by numerical methods using a computer.

The inner screen S2 behaves like a complete absorber of the primary field. However, once trapped between the screens, the field is completely internally reflected by S1 and S2. The screen S2 behaves like a perfect one-way mirror. Practical screens having these properties clearly cannot be continuous metal surfaces. Externally driven discrete wire arrays which approximate the calculated continuous surface current densities are used instead. For a common screen current, wires are placed at positions corresponding to equal areas under the current density distribution integrated over discrete intervals, as described in the above patent specifications.

Although active screening of a single hoop has been described in the above example, the principles of double screening apply to other geometries, for example flat screens as well as more complex coil geometries, some of which are used to produce linear gradients in NMR imaging.

On the basis of the analytical expression for the component of the magnetic field $B_z$ which is set out in equation (52), equations (59) and (60) become, for k-space.

$$aII_1(ka) = -bI_1(kb)j_\phi^1(k) - cI_1(kc)j_{100}^2(k), \text{ for } r>b \quad (61)$$

$$O = bK_1(kb)j_\phi^1(k) + cK_1(kc)j_\phi^2(k), \text{ for } r<a \quad (62)$$

which yield the current densities $$j_\phi^1(k) = \frac{-IaI_1(ka)}{bI_1(kb)}\left[1 - \frac{I_1(kc)K_1(kb)}{I_1(kb)K_1(kc)}\right]^{-1} \quad (63)$$

and $$j_\phi^2(k) = -j_\phi^1(k)\frac{b}{c}\frac{K_1(kb)}{K_1(kc)} \quad (64)$$

For k=0, $K_1(kb)/K_1(kc) = c/b$ and $I_1(ka)/I_1(kb) = a/b$ from which it is deduced that the total currents $I_1$, $I_2$ flowing in S1 and S2 are equal and opposite. From equations (63) and (64) there is obtained $$I_1 = -I\left(\frac{a}{b}\right)^2\left[1 - \left(\frac{a}{b}\right)^2\right]^{-1} \quad (65)$$

-continued $$= -I_2 \quad (66)$$

If $a=c$ thereby making the primary coil and $S_2$ coincident, the condition $b=a\sqrt{2}$ makes $I_1=-I==I_2$ and means that the coil and screens may be placed in series. For discrete wire arrays chosen to approximate the required continuous current distributions, equations (65) and (66) become $$N_0 I_0 = N_1 I_1 \left(\frac{b}{a}\right)^2 \left[1 - \left(\frac{c}{b}\right)^2\right] \quad (67)$$

and $$N_1 I_1 = -N_2 I_2 \quad (68)$$

where $N_o I_o$, $N_1 I_1$ and $N_2 I_2$ are the ampere-turns for the primary coil and screens S1 and S2 respectively. A more general series coil arrangement is possible by varying both the turns and screen radii in equations (67) and (68).

A Maxwell pair of two hoops with opposite currents may be used to generate a z-gradient field. Since double screening produces the free space field of hoops in the region $r<a$, the usual coil spacing $a\sqrt{3}$ obtains for the most linear gradient along the z-axis.

Figure 25:
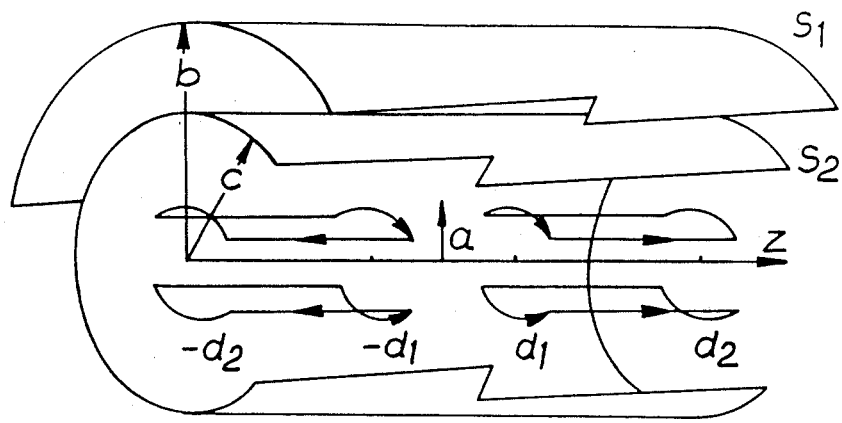
FIG. 25 is a perspective view of a double saddle coil used to produce transverse gradient fields which is screened by a double screen embodying the invention.

FIG. 25 shows a simple saddle coil of radius a used to produce a transverse gradient. Let this be shielded by two active cylindrical screens $S_1$ and $S_2$ with radii b and c respectively where $a \leq c < b$. For a standard saddle geometry with 120° arcs, the primary current is $$J_\phi(\phi,z) = I \{\delta(z-d_1) + \delta(z+d_1) - \delta(z-d_2) - \quad (69)$$
$$\delta(z+d_2)\} \times \{H(\phi + \pi/3)[1 - H(\phi - \pi/3)] -$$
$$H(\phi - 2\pi/3)[1 - H(\phi + 2\pi/3)]\}$$

where H(o) is the Heaviside function. The Fourier transform of equation (69) is $$J_\phi{}^m(k) = \frac{2\sin(m\pi/3)}{m\pi} I[\cos(kd_2) - \cos(kd_1)](1 - e^{im\pi}) \quad (70)$$

This is zero for m even or an integer of 3. Since there are now many values of m, equations (61) and (62) are generalized to give for two shields $$J_\phi{}^m(k) a I_m'(ka) = -b I_m'(kb) j_\phi{}^{1,m}(k) - c I_m'(kc) j_\phi{}^{2,m}(k) \quad (71)$$

$$0 = b K_m'(kb) j_\phi{}^{1,m}(k) + c K_m'(kc) j_\phi{}^{2,m}(k) \quad (72)$$

From equations (71) and (72) there is obtained the results that $$j_\phi{}^1(k) = \sum_m j_\phi{}^{1,m}(k) = \quad (73)$$
$$-\frac{a}{b} \sum_m J_\phi{}^m(k) \frac{I_m'(ka)}{I_m'(kb)} \left[1 - \frac{I_m'(kc) K_m'(kb)}{I_m'(kb) K_m'(kc)}\right]^{-1}$$

and $$j_\phi{}^2(k) = \sum_m j_\phi{}^{2,m}(k) = -\frac{b}{c} \sum_m j_\phi{}^{1,m}(k) \frac{K_m'(kb)}{K_m'(kc)} \quad (74)$$

These results evaluated at $k=0$ give for each separate arc pair at $\pm d_1$ and $\pm d_2$ the total azimuthal screen currents $I_1$ and $I_2$. The dominant components of these currents arise from the $m=1$ terms and may be simplified by noting that at $k=0$, $I_1'(ka)/I_1'(kb)=1$ and $K_1'(kb)/K_1'(kb)/K_1'(kc)=c^2/b^2$. The z-components of current flowing in the screens may be calculated by noting that $$\text{div } j|_{r=R} = 0 \quad (75)$$

which expanded gives $$\partial j_z/\partial z = -\frac{1}{R} \partial j_\phi/\partial \phi \quad (76)$$

Fourier transforming equation (76) gives $$j_z{}^m(k) = -\frac{m}{Rk} j_\phi{}^m(k) \quad (77)$$

Equation (77) for $R=b$ or $c$ and equations (73) and (74) give on transforming to z-space the actual screen surface densities.

The above results have shown that by introducing a second active screen the spatial response within a primary coil can be made to be independent of the surrounding screens. The inner screen may be positioned to be coincident with the primary coil and still retain the above advantages. While in the above description two active magnetic screens have been employed it is possible to extend the principles of active magnetic screening of coil structures to multiple screens. Use of two or more than two screens has the advantage that the screens can be designed so as not to vitiate or change the character of the magnetic field spatial response from the primary coil structure being screened. This is true even when the inner screen of a two or multiple screen structure is coincident with the primary coil structure.

The calculations and analytical expressions presented refer to continuous current density distributions in the screens. Practical active screens require discrete wire arrays which simulate the continuous current density distributions. Discrete screens also allow exploitation of the selective transmissive and reflective properties of the active magnetic shields.

The object of a magnetic screen is to provide a spatial current distribution which mimics that which is theoretically induced in a real and/or fictitious continuous conducting sleeve around a coil structure in which the coil itself is producing a time-dependent magnetic field gradient. Equation 24 describes an arrangement in which wires are equally spaced by with currents chosen again to mimic the induced surface current distribution in a continuous metal screen.

Several methods of varying the current in these conductors are:

1. To include in each conductor a small resistor chosen to give required current.
2. To change the diameter or the shape of the wire so as to affect its resistance in the right manner.
3. Change the composition of the conductor to affect its resistance. These situations are covered in FIGS. 30 and 31.

It will also be clear from the above discussion that when the conductor size is changed as in FIG. 31 and in the limit of uninsulated touching wires, we have the situation shown in FIG. 27. An alternative arrangement to this is a profiled cross-sectional band of material as shown in FIG. 26. Alternative ways of producing this band or its effect are shown in FIGS. 28 and 29. The thickness t of the band must be chosen such that the electro magnetic penetration depth δ is less than t for the highest frequency present in the current switching waveform.

Figure 34:
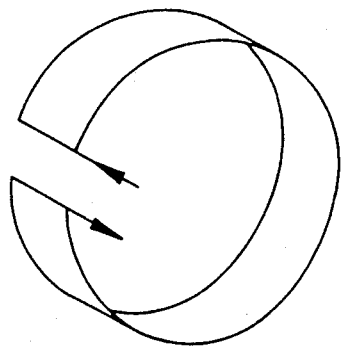
FIG. 34 shows a parallel band arrangement.
Figure 35:
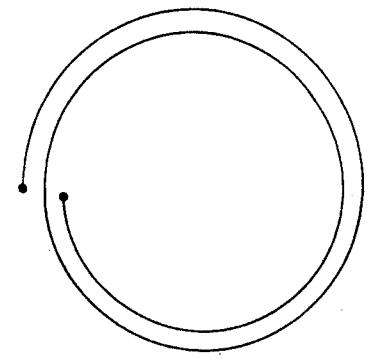
FIG. 35 shows a series arrangement.

It will be seen that the above conductor arrangements 26 to 31 could be parallel arrangements or bands as in FIG. 34 fed with appropriate total current along the edges indicated. However, it is conceivable that one could manufacture multi turn band structures producing a series arrangement as in FIG. 35.

An alternative approach using a constant standard wire section employs the wire arrangements in FIGS. 32 and 33. Here the wires are stacked in such a manner as to produce the desired current distribution. If the wires are uninsulated and touching this is an alternative method of producing the equivalent arrangement of FIG. 26. However, if the wires are insulated and touching it will readily be seen that all the turns may be in series. A series arrangement will have a much higher inductance but require only a small common current through each turn. The parallel arrangements discussed earlier require the driver circuitry to provide the total field screen current for a one turn arrangement as in FIG. 34.

In order to obtain images by magnetic resonance it is necessary to switch gradients rapidly. For typical magnetic gradient strengths the current I required is commonly around 150 Amps. These currents, when flowing in the static field B produce a force per unit length of $$F = I \times B$$

on the wires carrying this current. For parts of the gradient coil the field B and the current I may be perpendicular thus maximizing this force. The resultant motion of the wires causes acoustic noise which can be very loud if strongly coupled to the coil former. This problem is growing in severity with the use of higher static fields. The situation is further exacerbated by use of larger gradient coils where the wire length is greater over which the force can act. Rapid imaging strategies can also create more noise.

Solutions to the noise problem such as embedding the wires in rigid materials like concrete do help by lowering the natural resonances of the coil former and by absorbing some acoustic energy. Surrounding the wires with some soft acoustic absorbing material such as cotton wall can also reduce the noise. But these approaches treat the symptoms rather than the cause.

In a further example of the use of the present invention the problem is solved at source by reducing the B field to zero in the vicinity of the wires. This eliminates the force on and hence motion of the wires. As well as solving the noise problem, the lack of motion of the wires removes the possibility of progressive fatiguing and fracture of the conductors.

Figure 36:
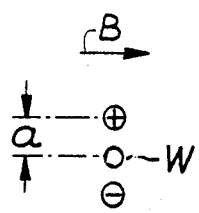
FIG. 36 shows various arrangements for assisting in reduction of acoustic vibration in MR coils by a gradient wire with (a) a wire pair (b) a wire array (c) a pair of conducting plates used to nullify the main field in the neighbourhood of the gradient coil and (d) a double active screen arrangement.

In order to do this the wires on the gradient coil are locally screened magnetically from B. This is achieved by using the principles of active screening. A single screen arrangement is created by arranging the screening wires in series. Different arrangements are shown in FIG. 36. With these arrangements the far field, i.e. coordinates x, z for a point P a distance $R \gg a$ where a is the half separation of the screen pair (FIG. 36), is effectively unperturbed. For an infinite straight wire screen the interior and exterior screening fields $B_c$ and $B_p$ ($R \gg a$) are respectively $$B_c = \frac{\mu_0 I}{\pi a} \tag{78a}$$

$$B_p = \frac{\mu_0 I}{2\pi} \frac{a}{R^4} (z^2 - x^2) \tag{78b}$$

where $R^2 = x^2 + z^2$ \quad (78c)

For small separation $B_c$ can be very large and $B_p$ small. This represents a net fall off rate which goes as $1/R^2$. For finite wires the fall off is basically dipolar i.e. goes as $1/R^3$.

Figure 36B:
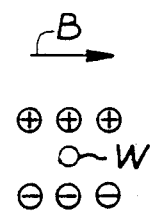
Figure 36C:
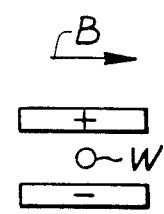
Figure 36D:
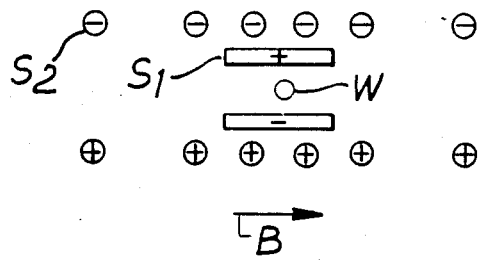

For parallel infinite sheets the fields are $$B_c = \mu_0 J \tag{79a}$$

$$B_p = 0 \tag{79b}$$

where J is the current density per unit length. For the arrangements sketched in FIGS. 36a to 36c respectively the screening efficacy will lie between the cases covered in Equations (78) and (79). Because the screen produces a static field, perturbation of the main field can be eliminated with a shim set. The screen or counter field generator need be active only during the experimental period.

To further reduce the extraneous static fields produced by the wire screening arrangement, a second active screen may be used in addition to the first screen.

Figure 37A:
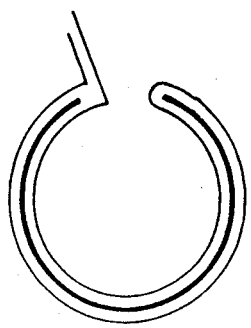
FIG. 37 shows winding strategies for screening wires about gradient coils of the (a) standard circular design and (b) saddle design.
Figure 37B:
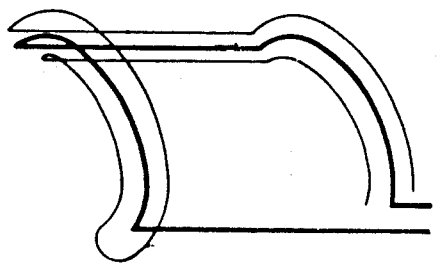

Such a double active screen arrangement is sketched in FIG. 36. The wire W is a roughly screened by a parallel plate arrangement $S_1$. Residual far fields arising from non-cancellation outside the plates is annulled by a second active screen $S_2$ comprising a set of conductors distributed appropriately. FIG. 37 shows two local wire screening strategies for a circular hoop (37a) and a saddle gradient (37b).

Using the wire screening arrangement described, the benefits of rapid switching of large gradients may be obtained within a high static magnetic field without acoustic noise.

Screening could also be applied to a Hall probe to increase its sensitivity to small field variation by removing the main central field.

In addition to the application of active magnetic screening to electromagnet and gradient coil design there are a number of possible applications in rf coil design. For example a fully screened series wound rf coil placed coaxially inside an unscreened coil would have zero mutual inductance. However an NMR sample placed inside the screen coil would sense fields generated by both coils. The coils though coaxial therefore behave electrically as though they were orthogonal This can have advantages in multi-nuclear irradiation and detection.

Figure 38:
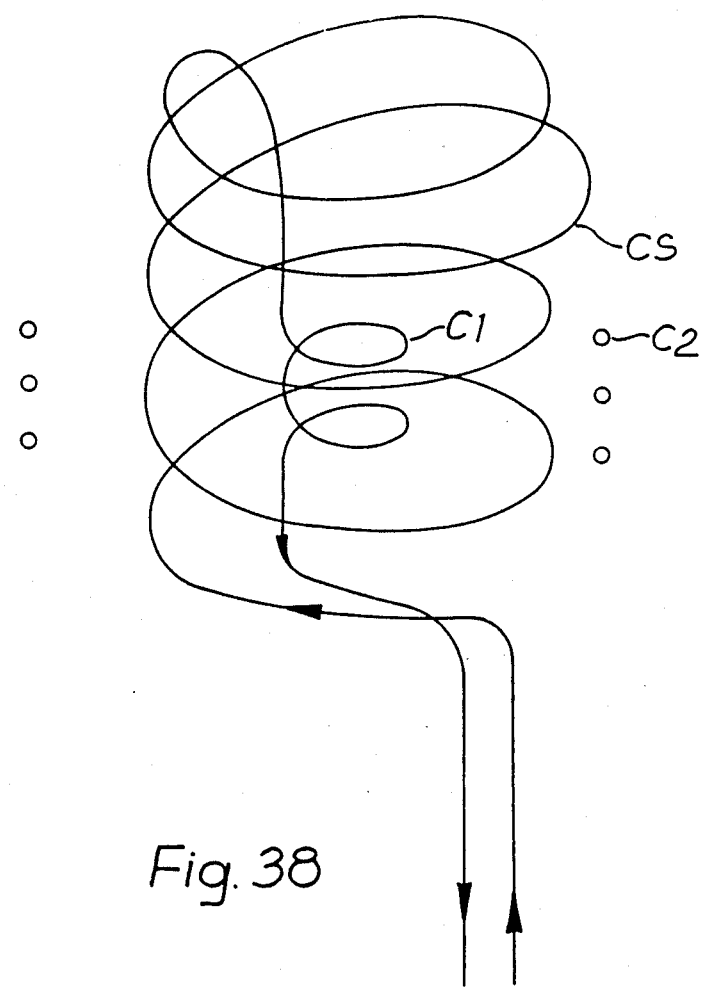
FIG. 38 illustrates the screening of one coil from the magnetic field of another.

A schematic example of one such possible configuration is shown in FIG. 38 where an inner coil C1 is wound inside an outer coil C2. The inner coil C1 can be screened by providing a suitably wound screening coil CS between the two coils C1 and C2. The screen coil CS is as shown connected in series with coil C1 to pass the same current. It is generally longer than the coils C1 and C2 to provide efficient screening and is wound such that the current in coil CS opposes that in coil C1. The exact positioning of the wires in coil CS is determined by using the above approach

We claim:

1. A screen for forming a protective barrier against a magnetic field of a type which has been produced by an energized primary electrical coil, said screen comprising:
   a set of electrical conductors defining two sides, one of which facing said primary electrical coil, and the other opposite said one side and on an opposite side of the primary electrical coil; and
   means for supplying the conductors of the set with electrical currents of magnitude such that a resultant distribution of said currents differs from a primary current distribution in the primary electrical coil and approximates an induced current distribution which would be formed in a continuous superconductive surface positioned in the place of said set so as to make the field everywhere on said one side of the screen away from the primary electrical coil substantially zero and thereby, when activated, to completely reflect the magnetic field.

2. A screen as claimed in claim 1 in which the screen current distribution localized to the surface of the hypothetical superconducting sheet is determined by the deconvolution of the magnetic field response function of the unit line elements of the conductor currents with the field to be screened.

3. A screen as claimed in claim 1 in which the conductors of the set are regularly spaced apart from each other.

4. A screen as claimed in claim 1 in which the conductors of the set are connected electrically in parallel and have different values of resistance in order to produce the desired screen current distribution.

5. A screen as claimed in claim 4 in which the different values of resistance of the set of conductors are produced by different thickness of the respective conductors.

6. A screen as claimed in claim 4 in which the different values of resistance of the set of conductors are produced by constructing the conductors with different compositions having appropriate values of electrical resistivity.

7. A screen as claimed in claim 1 in which the conductors of the set carry equal currents but are spaced apart from each other by different spacings in such a manner that the current in one conductor is equal to an integrated incremental superconductive surface current distribution, such incremental values being equal for each conductor so as to produce the desired screen current distribution.

8. A screen as claimed in claim 7 in which the number of screen conductors is even.

9. A screen as claimed in claim 7 in which the number of screen conductors is odd.

10. A screen as claimed in claim 1 in which the screen surface current distribution Jy, for an infinite flat screen, screening an infinite straight line primary, is defined by $$J_y = \left(\frac{1}{4\pi}\right) \cdot \frac{4Id}{d^2 + y^2} = J_1(d).$$

11. A screen as claimed in claim 1 in which the primary magnetic field is created by a current F in the primary coil and in which the current f defines the current in the screen and in which the Fourier transforms of the current components of f are defined in the case of coaxial cylindrical primary and screen geometry as:

$$f_z^m(k) = \frac{1}{2\pi} \int_{-\pi}^{\pi} d\phi e^{-im\phi} \int_{-\infty}^{\infty} dz e^{-ikz} f_z(\phi,z)$$

$$f_\phi^m(k) = \frac{1}{2\pi} \int_{-\pi}^{\pi} d\phi e^{-im\phi} \int_{-\infty}^{\infty} dz e^{-ikz} f_\phi(\phi,z)$$

and wherein the quantities $F_z^m(k)$ $F_\phi^m(k)$ being the components of the Fourier transform of F are defined in an analogous way.

12. A screen as claimed in claim 11 in which the relationship for the Fourier components of the currents induced in the screen to those in the gradient coils are as defined as $$f_\phi^m(k) = -F_\phi^m(k) \frac{a\, I_m'(ka)}{b^2\, I_m'(kb)}$$

13. A screen for forming a protective barrier against a magnetic field of a type which has been created by an energized primary coil in which the primary coil is surrounded by two or more active magnetic screening coils through which current is passed, comprising: an inner screen and an outer screen, the inner screen lying between the primary and the outer screen, each respective screen comprising a set of electrical conductors; and means for supplying the conductors of the set with electrical currents of magnitude such that there is no appreciable magnetic field outside the outer screen and the field within the inner screen substantially corresponds to the field that could be provided by the primary coil if the screen were not present.

14. A screen for forming a protective barrier against a magnetic field of a type which has been created by an energized primary coil in which the primary coil is surrounded by two or more active magnetic screening coils through which current is passed comprising: an inner screen and an outer screen, the inner screen being coincident with the primary coil, each respective screen comprising a set of electrical conductors; and means for supplying the conductors of the set with electrical currents of magnitudes such that there is no appreciate magnetic field outside the inner screen and the field within the inner screen substantially corresponds to the field that would be provided by the primary coil if the screens were not present.

15. A screen as claimed in claim 13 in which the surface currents, $f_\phi^{l,m}(z)$, $f_\phi^{z,m}(z)$ which lie on hypothetical cylinders of radii b & o respectively corresponding to the outer and inner screen, are defined in Fourier space as $$\begin{pmatrix} F_\phi^m(K)aI_m'(Ka) \\ 0 \end{pmatrix} = \begin{pmatrix} -bI_m'(Kb) & -cI_m'(Kc) \\ bK_m'(Kb) & cK_m'(Kc) \end{pmatrix} \begin{pmatrix} f_\phi^{1,m}(K) \\ f_\phi^{2,m}(K) \end{pmatrix}.$$

16. A screen as claimed in claim 14 in which the surface currents, $f_{100}^{l,m}(z)$, $f_\phi^{z,m}(z)$ which lie on hypothetical cylinders of radii b & o respectively corresponding to the outer and inner screen, are defined in Fourier space as $$\begin{pmatrix} F_\phi^m(K)aI_m'(Ka) \\ 0 \end{pmatrix} = \begin{pmatrix} -bI_m'(Kb) & -cI_m'(Kc) \\ bK_m'(Kb) & cK_m'(Kc) \end{pmatrix} \begin{pmatrix} f_\phi^{1,m}(K) \\ f_\phi^{2,m}(K) \end{pmatrix} \quad 71$$

17. An actively magnetically screened coil set around the screen of which is a second unscreened coil such that the mutual inductance between the said set and second coil is zero, which total coil system is supplied with currents at rf frequencies as an NMR transmitter/receiver orthogonal coil system in which each coil may be independently tuned to a different frequency.

18. A screen for forming a protective barrier against a magnetic field of a type which has been produced by an energized primary electrical coil, said screen comprising a set of electrical conductors; and means for supplying the conductors of the set with electrical currents of magnitude such that the resultant screen current distribution is different from the primary current distribution in the primary electrical coil and approximates the induced current distribution which would be formed in a continuous superconductive surface positioned in the place of said set so as to make selected components of the field on the side of the screen away from the primary electrical coil substantially zero and thereby to act as a complete reflector of the selected components of the magnetic field produced by the primary coil.

19. A screen for forming a protective barrier against a magnetic field of a type which has been produced by an energized primary electrical coil, said screen comprising: a first screen having a first set of electrical conductors and a second screen having a second set of electrical conductors, the first set of electrical conductors being located spaced from the primary electrical coil, and the second screen set of electrical conductors being positioned intermediate between said first screen set and said primary coil; and means for supplying the conductors of the first and second screen sets with electrical currents of magnitude such that the resultant current distribution is different from the current distribution in the primary electrical coil and approximates the induced current distribution which would be formed in continuous superconductive surfaces positioned in the place of said screen sets so as to make the field on the far side of the first screen set away from the primary electrical coil substantially zero and thereby to act as a complete reflector of the magnetic field produced by both the primary electrical coil and the second screen set of electrical conductors, and so as to make the field on the primary coil side of the second screen set substantially equal to the magnetic field of the primary in the absence of the screens the second set thereby appearing as (a) a reflector of the field produced by the final screen set and (b) transparent to the field produced by the primary coil.

20. A coil set for producing a desired magnetic field within a defined volume, said coil set comprising:
a first coil situated at a first location which defines the volume and at least one second coil situated at a second location, which embraces the volume,
the first coil having a first predetermined number of conductors to produce a first current distribution within the first coil to produce a first magnetic field, said at least one second coil having a second predetermined number and pattern of conductors to produce a second current distribution within the second coil to produce a second magnetic field, and
wherein the second magnetic field produced by the second coil provides a screen for the rest magnetic field produced by the first coil such that the resultant magnetic field on the opposite side of the second coil to the first coil is substantially zero, and the resultant magnetic field on the opposite side of the first coil to the second coil constitutes the desired magnetic field, and in which the first and second predetermined number of conductors are different from each other and in which the first current distribution is different from the second current distribution.

21. A method of producing a desired magnetic field within a defined volume, said method comprising the steps of:
situating a first coil at a first location which defines the volume the first coil having a first predetermined number and pattern of conductors designed to produce a first current distribution in the first coil to produce a first magnetic field, and
situating at least one second coil at a second location which embraces the volume, the second coil having a second predetermined number and pattern of conductors designed to produce a second current distribution in the second coil to produce a second magnetic field,
wherein the second magnetic field produced by the second coil provides a screen for the first magnetic field produced by the first coil such that the resultant magnetic field on the opposite side of the second coil to the first coil is substantially zero, and the resultant magnetic field on the opposite aide of the first coil to the second coil constitutes the desired magnetic field, and in which the first and second predetermined number of conductors are different to each other and in which the first current distribution is different from the second current distribution.

22. A gradient coil system for use in an NMR apparatus including a coil set for producing a desired gradient magnetic field within a defined volume, the coil set comprising:
a primary coil designed to provide a gradient field situated at a first location defining the volume and at least one screen coil surrounding the main coil,
the primary coil having a first predetermined number and pattern of conductors comprising a first set to produce when energized a first current distribution in the primary coil to produce a screening magnetic field, and
wherein the said screening magnetic field produced by the screen coil provides a screen for the gradient magnetic field produced by the primary coil such that the resultant magnetic field on the opposite side of the screening coil to the primary coil is substantially zero, and the resultant magnetic field in the defined volume is the desired gradient magnetic field, and
in which the first and second predetermined number of conductors are different from each other and in which the first current distribution is different to the second current distribution.

23. A coil set for producing a desired magnetic field within a defined volume, said coil set comprising:

a first coil situated at a first location which defines said volume and at least one second coil situated at a second location which surrounds said volume, the first coil having a first predetermined number and pattern of conductors to produce when energized a first current distribution within the first coil to produce a first magnetic field, the second coil having a second predetermined number and pattern of conductors to produce when energized a second current distribution within the second coil to produce a second magnetic field, and wherein the second coil provides a screen for specified components of the first magnetic field produced by the first coil such that the specified components of the magnetic field on the opposite side of the second coil to the first coil are substantially zero, and the resultant magnetic field on the opposite side of the first coil to the second coil constitutes the desired magnetic field, and in which the first and second predetermined number of conductors are different to each other and in which the first current distribution is different to the second current distribution.

24. A coil set for producing a desired magnetic field within a defined volume, said coil set comprising:

a first coil situated at a first location a second coil situated at a second location, the first coil having a first predetermined number and pattern of conductors to produce when energized a first current distribution within the first coil to produce the desired magnetic field and the second coil having a second predetermined number and pattern of conductors to produce a second current distribution in the second coil to produce when energized a first screening magnetic field, the first and second predetermined number of conductors being unequal and in which the first current distribution is not identical to the second current distribution, a third coil positioned intermediate between the first and second coils, the third coil comprising a third winding having a third predetermined number and pattern of conductive to produce when energized a third current distribution in the coil to produce a second screening magnetic field, and wherein the first and second screening magnetic fields combine together with the field produced by the first coil to provide substantially zero magnetic field outside the second coil without causing any substantial change in the desired magnetic field in the defined volume.

25. A screen for a magnetic field comprising;

a set of spaced electrical conductors; and means for supplying electrical currents to the electrical conductors;

said spaced electrical conductors having such a spacing, and said supplying means forming such a current flow therein, as to satisfy, and act to form, boundary conditions mimicking conditions which would exist in a superconducting surface occupying a position of said electrical conductors.

26. A screen as in claim 25, wherein said spaced conductors are spaced at such discrete intervals, and have such a current flow, as to cause integrals of surface current distribution between said conductors at said intervals to be equal to one another.

27. A screen as in claim 25, wherein said conductors are disposed in a plane and so spaced from one another, and so energized with a current $I_n$ in a way such that:

$$\int_{\text{any one conductor}}^{\text{any other conductor}} J_y \, dy = A$$

wherein A is a constant value, and $$J_y = \left(\frac{1}{4\pi}\right) \frac{4Id}{r^2}$$

wherein I is the current $I_n$ in the conductor, d is a distance from a point emanating the magnetic fields to said plane, and r is a radial distance from the point to the conductor.

28. A screen as in claim 27, wherein each said conductor carries an equal current I, and wherein said conductors are located at positions y1, y2, ... yn, such that $$\int_{yx}^{yx1} J_y dy = A,$$

where yx and yx1 are any two adjacent conductors y1, y2 ... yn.

29. A screen as in claim 27, wherein each said conductor carries a different current $I_n$, and said conductors are equally spaced from one another by a distance $\Delta y$, such that $$\int_{(n-1)\Delta y}^{n\Delta y} J_y(n\Delta y) dy$$

where $\Delta y$ is a distance between the two conductors.

30. A screen as in claim 27, wherein said set of spaced electrical conductor comprises two parallel screens, each having a current distribution J1(d1) and J1(d2) following the equation $$J1 = \left(\frac{1}{4\pi}\right)\frac{4Id}{r^2} + \sum_n J_n(d_n)$$

wherein $J_n(d_n)$ are induced surface currents induced from the other screen.

31. A screen as in claim 25 wherein said magnetic field is produced by a hoop having a radius $r_1$, within which a current $I_1$ flows, and said electrical conductors are located according to the equation $$\int_{\text{any one conductor}}^{\text{any other conductor}} J_y \, dy = A$$

wherein A is a constant, and $$J_y = \left(\frac{1}{4\pi}\right)\frac{4I_2 d}{(r_2)^2}$$

wherein $I_2$ is the current in the conductor, d is a distance from a point emanating the magnetic fields to a plane in which the conductor set is formed, and r is a radial distance from the point to the conductor;

wherein a current flowing through the screen is $$I_2 = -\left(\frac{r_1}{r_2}\right)^2 I_1$$

where $r_1$ is the primary coil radius and $r_2$ is the screen radius.

32. A screen for a magnetic field comprising;

a set of spaced, parallel, substantially straight, electrical conductors forming a plane; and means for supplying electrical currents to the electrical conductors in a way such that the spacing of said spaced electrical conductors and the currents therein satisfy and act to form boundary conditions mimicking conditions which would exist in a surface of a (hypothetical) superconducting plate occupying a position of said electrical conductors.

33. A screen as in claim 32, wherein said spaced conductors are spaced at such discrete intervals, and have such a current flow, as to cause integrals of surface current distribution between said conductors at said intervals to be equal to one another.

34. A screen as in claim 32, wherein said conductors are disposed in a plane and so spaced from one another, and so energized with a current $I_n$, in a way such that:

$$\int_{\text{any one conductor}}^{\text{any other conductor}} J_y \, dy = A$$

wherein A is a constant value, and $$J_y = \left(\frac{1}{4\pi}\right)\frac{4Id}{r^2}$$

wherein I is the constant $I_n$ in the conductor, d is a distance from a point emanating the magnetic fields to said plane, and r is a radial distance from the point to the conductor.

35. A screen as in claim 34, wherein each said conductor carries an equal current I, and wherein said conductors are located at positions y1, y2, ... yn, such that $$\int_{yx}^{yx1} J_y dy = A,$$

where yx and yx1 are any two adjacent conductor y1, y2 ... yn.

36. A screen as in claim 34, wherein each said conductor carries a different current $I_n$, and said conductors are equally spaced from one another by a distance ▲y, such that $$\int_{(n-1)\Delta y}^{n\Delta y} J_y(n\Delta y) dy$$

where ▲y is a distance between the two conductors.

37. A screen as in claim 34, wherein said set of spaced electrical conductor comprises two parallel screens, each having a current distribution J1(d1) and J1(d2) following the equation $$J1 = \left(\frac{1}{4\pi}\right)\frac{4Id}{r^2} + \sum_n J_n(d_n)$$

wherein $J_n(d_n)$ are induced surface currents induced from the other screen.

* * * * *

UNITED STATES PATENT AND TRADEMARK OFFICE
CERTIFICATE OF CORRECTION

PATENT NO. : 4,978,920

DATED : December 18, 1990

INVENTOR(S) : Peter Mansfield; Barry L. W. Chapman; Robert Turner; Roger M. Bowley It is certified that error appears in the above-identified patent and that said Letters Patent is hereby corrected as shown below:

Column 22, line 67, change "$f_{100}$" to --$f\phi$--.

Column 24, line 5, change "rest" to --first--.

Column 24, line 48, change "main" to --primary--;

line 53, after "coil" insert --, and the screening coil having a second predetermined number of conductors--.

Signed and Sealed this

Twenty-first Day of March, 1995

BRUCE LEHMAN

Attest:

Attesting Officer

Commissioner of Patents and Trademarks